United States Patent
Suh

(10) Patent No.: US 8,218,359 B2
(45) Date of Patent: Jul. 10, 2012

(54) PHASE CHANGE RANDOM ACCESS MEMORY AND METHODS OF MANUFACTURING AND OPERATING SAME

(75) Inventor: Dong-seok Suh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 467 days.

(21) Appl. No.: 12/455,007

(22) Filed: May 27, 2009

(65) Prior Publication Data

US 2009/0296457 A1    Dec. 3, 2009

(30) Foreign Application Priority Data

May 27, 2008    (KR) .................. 10-2008-0049287

(51) Int. Cl.
*G11C 11/00* (2006.01)

(52) U.S. Cl. ............. 365/163; 257/4; 257/E45.002

(58) Field of Classification Search .......... 365/163, 365/148; 257/104, 4, E45.001, E45.002
See application file for complete search history.

(56) References Cited

U.S. PATENT DOCUMENTS

| | | | |
|---|---|---|---|
| 6,806,528 B2 | 10/2004 | Lee et al. | |
| 7,018,911 B2 | 3/2006 | Lee et al. | |
| 8,085,583 B2 * | 12/2011 | Suh | 365/163 |
| 2004/0042316 A1 | 3/2004 | Lee et al. | |
| 2005/0030832 A1 | 2/2005 | Lee et al. | |
| 2006/0273298 A1 * | 12/2006 | Petti | 257/5 |
| 2007/0099377 A1 | 5/2007 | Happ et al. | |
| 2010/0034016 A1 * | 2/2010 | Liu | 365/163 |
| 2011/0235408 A1 * | 9/2011 | Minemura et al. | 365/163 |

FOREIGN PATENT DOCUMENTS

| | | |
|---|---|---|
| JP | 2007243169 | 9/2007 |
| KR | 1020040022275 A | 3/2004 |
| KR | 1020070025304 A | 3/2007 |
| KR | 1020070102295 A | 10/2007 |

* cited by examiner

*Primary Examiner* — Douglas King
(74) *Attorney, Agent, or Firm* — Onello & Mello, LLP

(57) ABSTRACT

A phase change memory device includes a switching device, a phase change storage node connected to the switching device, and a gate electrode which is spaced apart from the phase change storage node and increases an electrical resistance of the storage node during a reset programming operation. The gate electrode may be disposed around the phase change storage node, and may be used for applying an electric field to the phase change storage node.

6 Claims, 8 Drawing Sheets

PHASE CHANGE RANDOM ACCESS MEMORY AND METHODS OF MANUFACTURING AND OPERATING SAME

CROSS-REFERENCE TO RELATED PATENT APPLICATION

This application claims the benefit of Korean Patent Application No. 10-2008-0049287, filed on May 27, 2008, in the Korean Intellectual Property Office, the disclosure of which is incorporated herein in its entirety by reference.

BACKGROUND

An exemplary embodiment of the inventive concept relates to a phase change random access memory device and methods of manufacturing and operating the same.

A phase change random access memory (PRAM) device is a memory device which stores binary data '0' and '1' through a change in electrical resistance values between a crystalline state of the PRAM and an amorphous state of the PRAM. To change the state of the PRAM device from a crystalline state to an amorphous state, an electrical current is applied to the PRAM device to generate sufficient Joule heat to melt a portion of phase change material. The electrical current is referred as a reset current.

One of the most important factors toward the development of high-integration PRAM devices is reduction of the reset current. Methods of reducing the reset current include employing a method of increasing the resistance of a bottom electrode contact (BEC) by changing its composition, and by employing a ring-shaped BEC.

According to these methods, high-Joule heat may be generated, and, at the same time, the reset current can be reduced. However, these methods also increase the electrical resistance of the PRAM device in a set state. Thus, the ratio of the reset resistance to the set resistance may decrease. In this case, the sensing margin for reading data becomes smaller. Thus, it may be more difficult to determine whether the read data is '1' or '0', which can lead to device malfunction.

SUMMARY OF THE INVENTIVE CONCEPT

An exemplary embodiment of the inventive concept provides a phase change memory device capable of reducing reset current while not affecting set resistance.

An exemplary embodiment of the inventive concept provides a method of manufacturing such a phase change memory device.

An exemplary embodiment of the inventive concept provides a method of operating such a phase change memory device.

In one aspect, a phase change memory device includes: a switching device; a phase change storage node connected to the switching device; and a gate electrode which is spaced apart from the phase change storage node and increases an electrical resistance of the storage node during a reset programming operation.

The switching device may include at least one of a diode and a transistor.

The phase change memory device may further include an ohmic contact conductive layer in series between the switching device and the phase change storage node.

The phase change memory device may further include a space insulation layer between the storage node and the gate electrode.

The gate electrode may be positioned to surround sidewalls of the phase change storage node.

The phase change memory device may further include a plurality of the switching devices and a plurality of the phase change storage nodes, wherein the gate electrode corresponds with at least one of the storage nodes.

The gate electrode may be an element to which an electric field is applied to the phase change storage node.

In another aspect, a method of manufacturing a phase change memory device include: forming a switching device on a substrate; forming a phase change storage node which is connected to the switching device; and forming a gate electrode that is spaced apart from, and that surrounds, the phase change storage node.

Forming the phase change storage node and forming the stack further may include: forming a stack covering the switching device and including the gate electrode; forming the gate electrode on the stack; forming a via hole through the gate electrode, thereby exposing the switching device; forming a space insulation layer on inner sidewalls of the via hole; and filling the via hole, in which the space insulation layer is formed, with a phase change material layer.

Forming the stack may further include, prior to forming the via hole: forming a first insulation layer covering the switching device; and sequentially forming the gate electrode and a second insulation layer on the first insulation layer.

The space insulation layer may comprise one of hafnium oxide (HfO), aluminium oxide (AlO), silicon nitride (SiN), and silicon oxide (SiO).

The gate electrode may be an element to which an electric field is applied to the phase change storage node.

Forming the switching device may further include: forming a wordline on the substrate; forming a first semiconductor layer on the wordline; and forming a second semiconductor layer on the first semiconductor layer, or may further include: forming an interlayer insulation layer on the substrate; forming a contact hole, by which the substrate is exposed, in the interlayer insulation layer; and forming the switching device in the contact hole.

The method may further include forming an ohmic contact conductive layer on the second semiconductor layer.

In another aspect, a method of operating a phase change memory device which include a switching device, a phase change storage node connected to the switching device, and a gate electrode which is spaced apart from the phase change storage node and increases an electrical resistance of the storage node during a reset programming operation, include applying a first voltage to the phase change storage node.

The method may further include: increasing an electrical resistance of the phase change storage node by applying a second voltage to the gate electrode prior to, or simultaneous with, applying the first voltage to the phase change storage node; and removing the application of the second voltage to the gate electrode as the application of the first voltage to the phase change storage node is completed.

The first voltage may be a writing voltage or a reading voltage.

The method may further include applying a third voltage, which is different from the first voltage, to the phase change storage node, after the application of the first voltage to the phase change storage node is completed and after the application of the second voltage to the gate electrode is removed.

The first voltage can be one of a writing voltage and a voltage for changing written data, and the third voltage can be one of a reading voltage and a voltage for changing written data.

The gate electrode may be an element to which an electric field is applied to the phase change storage node.

BRIEF DESCRIPTION OF THE DRAWINGS

Example embodiments will now be described more fully with reference to the accompanying drawings. In the drawings, the thicknesses of layers and regions may be exaggerated for clarity.

DETAILED DESCRIPTION OF EMBODIMENTS OF THE INVENTIVE CONCEPT

Figure 1:
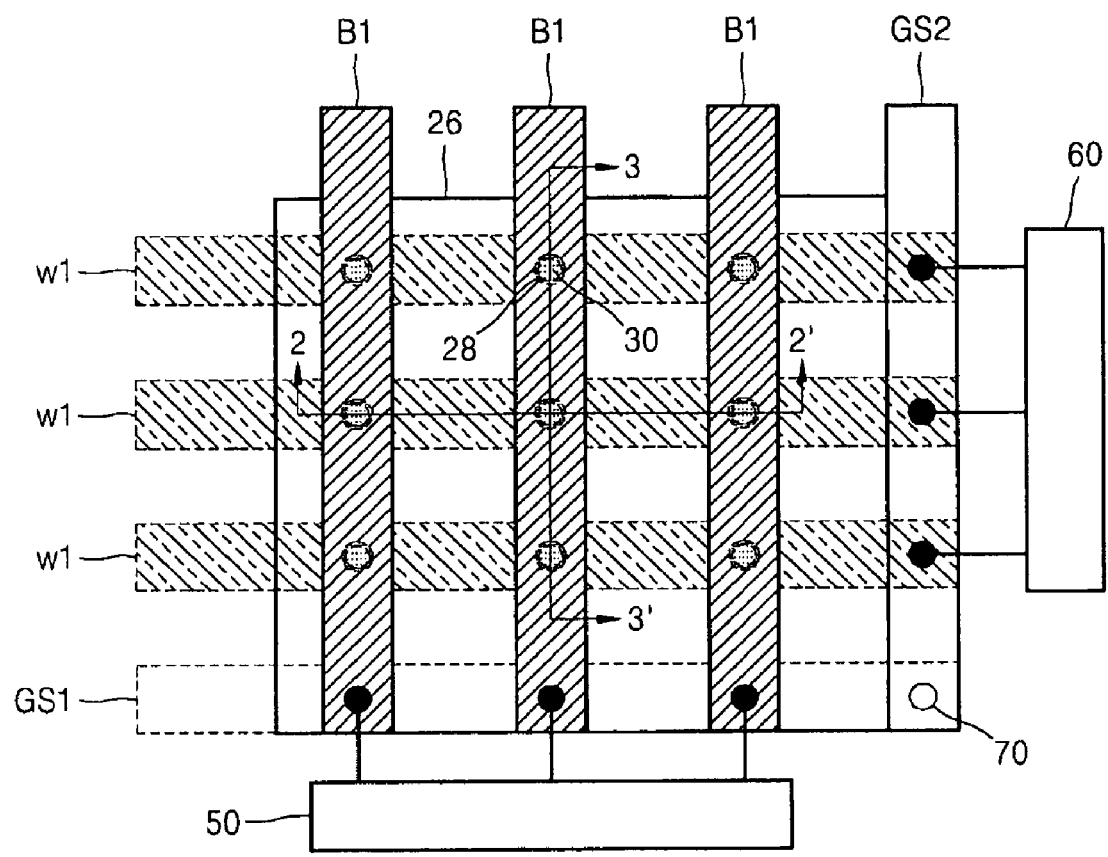
FIG. 1 is a plan view of a memory device according to an exemplary embodiment of the inventive concept.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while various modifications and alternative forms of the example embodiments are possible, embodiments thereof are shown by way of example in the drawings and will herein be described in detail. It should be understood, however, that there is no intent to limit the example embodiments to the particular forms disclosed, but to the contrary, the example embodiments are to cover all modifications, equivalents, and alternatives falling within the scope of example embodiments. Like numbers refer to like elements throughout the description of the figures.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, a phase change random access memory (PRAM) device and methods of manufacturing and operating the same according to the inventive concept will be described in detail by explaining preferred embodiments of the inventive concept with reference to the attached drawings. In the drawings, the thicknesses of layers and regions may be exaggerated for clarity.

FIG. 1 is a plan view of a memory device according to an exemplary embodiment of the inventive concept. FIG. 1 shows a memory array block included in the memory device according to an exemplary embodiment of the inventive concept.

Referring to FIG. 1, a phase change material layer 30, which can be configured to operate as a storage node, can be disposed at a region where a wordline W1 and a bitline B1 cross each other. The phase change material layer 30, in this example, is surrounded by a space insulation layer 28. A first gate selecting line GS1 can be disposed in parallel to the wordline W1, and a second gate selecting line GS2 may be disposed in parallel to the bitline B1. A gate contact plug 70 can be disposed at a region where the first and second gate selecting lines cross each other. The phase change material layer 30 surrounded by the space insulation layer 28 can, in turn, be surrounded by a gate electrode (not shown), and the first and second gate selecting lines GS1 and GS2 can be connected to the gate electrode via the gate contact plug 70. The first gate selecting line GS1 and the second gate selecting line GS2 can apply an electric field to the phase change material layer 30 via the gate electrode, and, in other embodiments, only one of the first and second gate selecting lines GS1 and GS2 is disposed. Furthermore, in an embodiment where both the first and second gate selecting lines GS1 and GS2 are disposed, power can be supplied to only to one of the first and second gate selecting lines GS1 and GS2. Furthermore, the first and second gate selecting lines GS1 and GS2 can be vertically spaced apart from each other and connected to the gate electrode separately. Furthermore, the first and second gate selecting lines GS1 and GS2 can also be disposed on a same plane of the device and together connected to the gate electrode.

A second insulation layer 26 can be the top layer of a stacked structure including the gate electrode. The bitline B1 may be selected by a bitline selecting circuit 50, and the wordline W1 may be selected by a wordline selecting circuit 60. Thus, a particular phase change material layer 30 to which data is written or from which data is read may be selected based on selections of the bitline selecting circuit 50 and the wordline selecting circuit 60.

A memory device according to an exemplary embodiment of the inventive concept may include a plurality of the memory array blocks shown in FIG. 1. In this case, each of the memory array blocks may include a gate selecting line for selecting a gate electrode. The gate selecting lines included in each of the memory array blocks may be first and second gate selecting lines GS1 and GS2 or one of the first and second gate selecting lines GS1 and GS2 as shown in FIG. 1.

Figure 2:
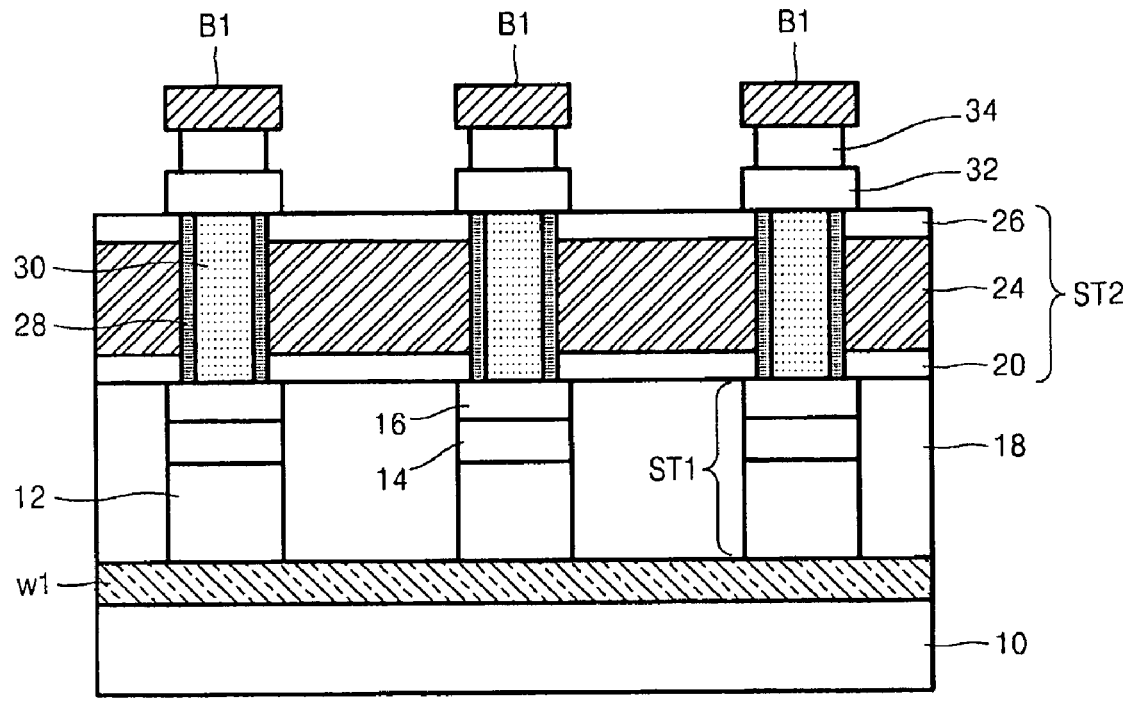
FIG. 2 is a sectional view of the memory device of FIG. 1, obtained along section line 2-2'.

FIG. 2 is a sectional view taken along section line 2-2' of FIG. 1. Referring to FIG. 2, the wordline W1 can be formed on a substrate 10. The substrate 10 can, for example, include a P type semiconductor substrate or an N type semiconductor substrate. A first semiconductor layer 12, a second semiconductor layer 14, and a conductive layer 16 can be sequentially stacked on the wordline W1 to form a stack ST1. The first semiconductor layer 12 may be an N type semiconductor layer, i.e., an N− type semiconductor layer. The second semiconductor layer 14 may be a P type semiconductor layer, i.e., a P+ type semiconductor layer. Alternatively, impurities of opposite types may be doped into the first and second semiconductor layers 12 and 14. Thus, the first semiconductor layer 12 may be a P type semiconductor layer and the second semiconductor layer 14 may be an N type semiconductor layer. The first and second semiconductors 12 and 14 may form a diode, which is a type of a switching device. Therefore, any material which is capable of operating as a semiconductor diode may be used as a material forming the first and second semiconductor layers 12 and 14. The conductive layer 16 can comprise an ohmic contact layer disposed to reduce a contact resistance between the second semiconductor layer 14 and the phase change material layer 30. If the contact resistance between the second semiconductor layer 14 and the phase change material layer 30 is not significant enough to affect operations of a memory device, the conductive layer 16 may be omitted. The stack ST1 may be surrounded by an interlayer insulation layer 18. A stack ST2 covering the top surface of the interlayer insulation layer 18 and partially exposing the conductive layer 16 can be disposed on the interlayer insulation layer 18. The stack ST2 can be formed by sequentially stacking a first insulation layer 20, a gate electrode 24, and the second insulation layer 26. The first insulation layer 20 can be, for example, a metal layer, such as a hafnium oxide (HfO) layer, an aluminium oxide (AlO) layer, a silicon nitride (SiN) layer, or a silicon oxide (SiO) layer.

The gate electrode 24 is constructed and arranged to increase the electrical resistance of the phase change material layer 30 when data is to be recorded; that is, the phase change material layer 30 is to be changed from a crystalline state to an amorphous state during a reset programming operation. During the reset programming operation, a voltage may be applied to the gate electrode 24. As a result, an electric field can be applied to the phase change material layer 30 by the gate electrode 24, and thus the electrical resistance of the phase change material layer 30 can increase. Therefore, the gate electrode 24 can be used as a means for applying the electric field to the phase change material layer 30. The material of the gate electrode 24 can comprise a conductor, a semiconductor, a metal, or a metal nitride. For example, the gate electrode 24 may be a conductor with specific resistance between 1 E-6 Ωcm and 10 Ωcm. Furthermore, the gate electrode 24 can be a semiconductor layer containing silicon (Si). Furthermore, the gate electrode 24 can be a layer of a general metal or a metal nitride layer of the metal. The second insulation layer 26 can be identical to the first insulation layer 20. The space insulation layer 28 and the phase change material layer 30 can be formed on an exposed region of the conductor layer 16, or, if the conductive layer 16 is not applied, on the second semiconductor layer 14. The respective heights of the space insulation layer 28 and the phase change material layer 30 can be the same as that of the stack ST2. Sidewalls of the phase change material layer 30 can be completely surrounded by the space insulation layer 28. The space insulation layer 28 can be disposed between the phase change material layer 30 and the layer stack ST2. The space insulation layer 28 can be formed of the same material as that used to form the first insulation layer 20.

In some embodiments, the phase change material layer 30 may be an In—Ge—Sb—Te layer. Furthermore, the phase change material layer 30 may be one of a Ge—Sb—Te layer, As—Sb—Te layer, As—Ge—Sb—Te layer, Sn—Sb—Te layer, [(5A group element)-(Sb or Bi)—Te] layer, [(6A group element)-(Sb or Bi)—Te] layer, [(5A group element)-Sb—Se] layer, and [(6A group element)-Sb—Se] layer. Furthermore, the phase change material layer 30 may contain In. For example, the phase change material layer 30 may be one of the In—Sb layer, In—Sb—Te layer, and In—Te layer. Furthermore, nitrogen or carbon may be doped into the phase change material layer 30, and the phase change material layer 30 may be a Te—Ag—Ge—Sb layer or Ge—Sb layer.

A top electrode 32 covering the phase change material layer 30 and the space insulation layer 28 may be disposed on the stack ST2. A top electrode contact layer 34 may be disposed on the top electrode 32. The bitline B1 is disposed on the top electrode contact layer 34.

Figure 3:
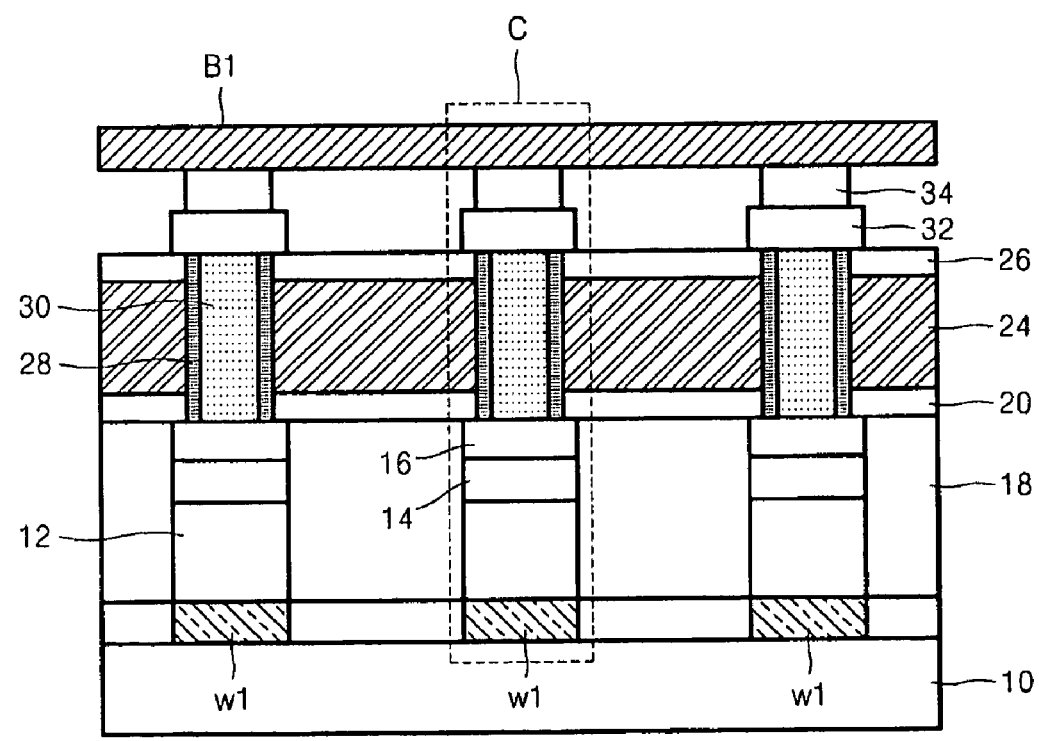
FIG. 3 is a sectional view of the memory device of FIG. 1, obtained along section line 3-3'.

FIG. 3 is a sectional view along section line 3-3' of FIG. 1. Referring to FIG. 3, FIG. 3 is identical to FIG. 2 except that directions of the wordline W1 and the bitline B1 are reversed. Therefore, detailed descriptions of FIG. 3 will be omitted. In FIG. 3, reference number C refers a unit cell wherein data is recorded.

Next, referring to FIGS. 4 through 9, a method of manufacturing a memory device according to an exemplary embodiment of the inventive concept will be described.

Since the same manufacturing process may be used for manufacturing all memory cells included in a memory device according to an exemplary embodiment of the inventive concept, descriptions of a method of manufacturing the unit cell C1 shown in FIG. 3 will be given instead of descriptions on the method of manufacturing a memory device according to an exemplary embodiment of the inventive concept.

Figure 4:
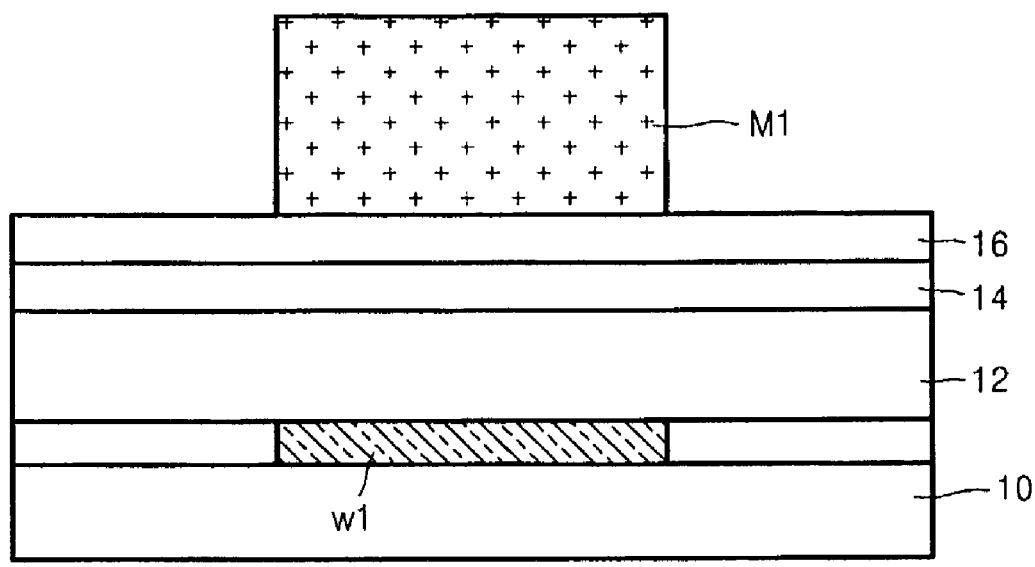
FIGS. 4 through 9 are sectional views illustrating a method of manufacturing a memory device according to an exemplary embodiment of the inventive concept.
Figure 5:
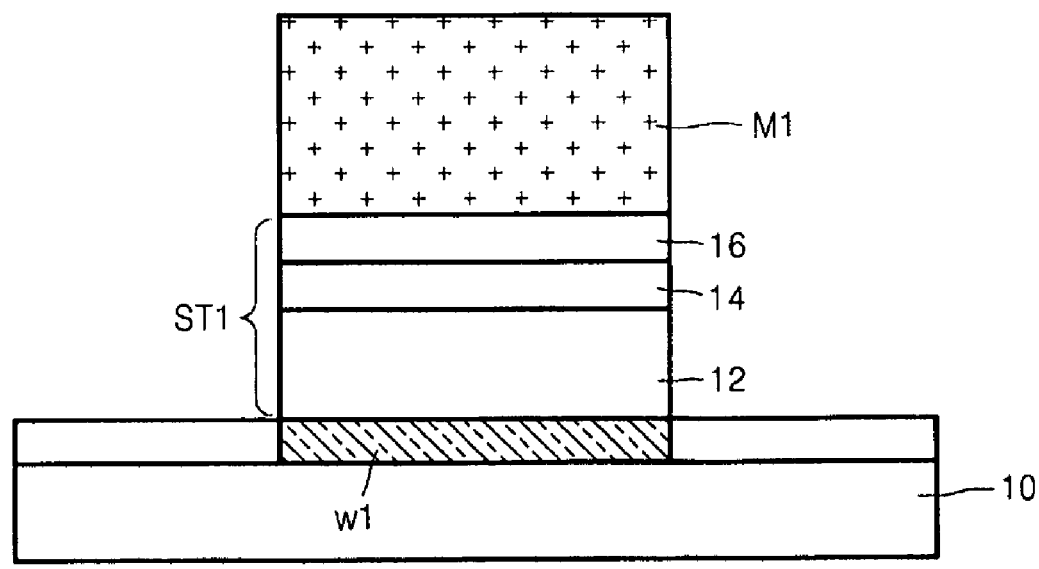

Referring to FIG. 4, a wordline W1 may be formed on a substrate 10. An insulation layer 11 covering the wordline W1 may be formed on the substrate 10 and is planarized. The planarization can be performed by using a chemical mechanical polishing (CMP) method or an etchback method, for example, until the top surface of a wordline W1 is exposed. The wordline W1 can also be formed using a damascene method. A first semiconductor layer 12 covering the wordline W1 may be formed on the insulation layer 11. A second semiconductor layer 14 and a conductive layer 16 may be sequentially stacked on the first semiconductor layer 12. The first semiconductor layer 12, the second semiconductor layer 14, and the conductive layer 16 may be formed of the material layers stated above in the descriptions of FIG. 2. A mask M1 defining a region for forming a diode may be formed on the conductive layer 16. The mask M1 may be arranged to be located on, and correspond with, the wordline W1. Next, the conductive layer 16, the second semiconductor layer 14, and the first semiconductor layer 12 around the mask M1 can be sequentially etched. At this time, the etching may be performed until the wordline W1 is exposed. As a result, a stack ST1 including the first semiconductor layer 12, the second semiconductor layer 14, and the conductive layer 16 as shown in FIG. 5 may be formed on the wordline W1. In the stack ST1, the first and second semiconductor layers 12 and 14 may form a diode, which is a type of a switching device. The conductive layer 16 is optional. Thus, if the contact resistance between the second semiconductor layer 14 and the phase change material layer to be applied above the stack ST1 is low, the conductive layer 16 need not be present. After the etching is completed, the mask M1 is removed.

Figure 6:
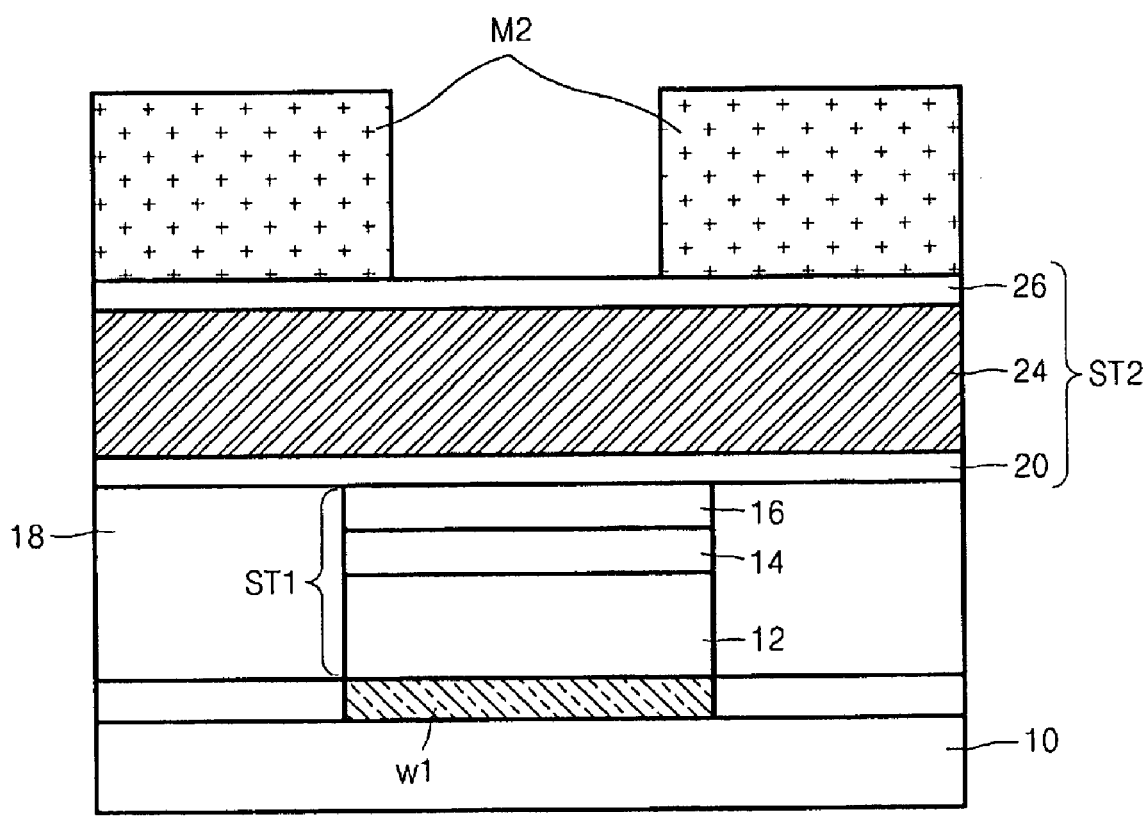
Figure 7:
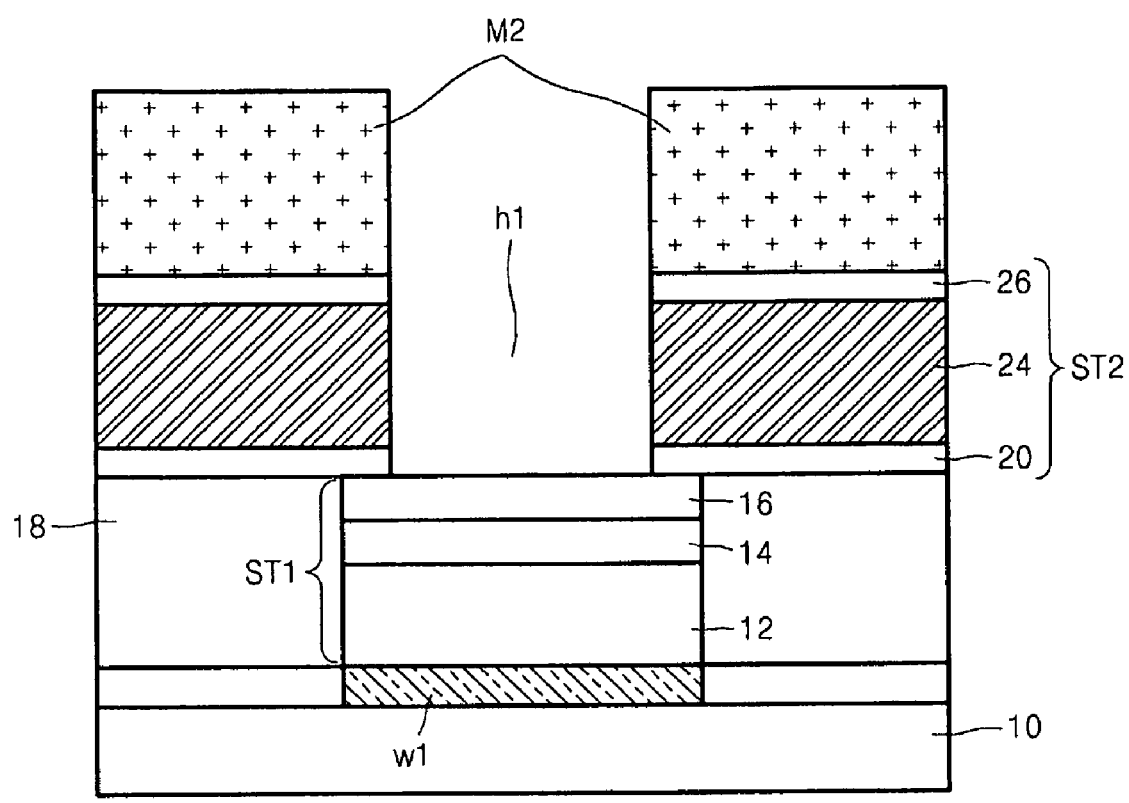

Referring to FIG. 6, regions surrounding the stack ST1 can be filled with the interlayer insulation layer 18. Next, the first insulation layer 20 covering the top surface of the stack ST1 can be formed on the interlayer insulation layer 18. The gate electrode 24 and the second insulation layer 26 may be sequentially formed on the first insulation layer 20. The first and second insulation layers 20 and 26 and the gate electrode 24 can be formed of the material layers stated above in the descriptions of FIG. 2. A mask M2 can be formed on the second insulation layer 26. The mask M2 is arranged to expose a region in which a storage node is to be formed, that is, a region in which a phase change material layer is to be formed. The region exposed by the mask M2 can be an upper surface of the second insulation layer 26 formed on the stack ST1. After the formation of the mask M2, the exposed region in the top surface of the second insulation layer 26, the gate electrode 24, and the first insulation layer 20 are sequentially etched, wherein the gate electrode 24 and the first insulation layer 20 are beneath the exposed region. The etching may be performed until the top surface of the conductive layer 16 of the stack ST1 is exposed. Thus, as shown in FIG. 7, a via hole h1 in which the top surface of the conductive layer 16 is exposed may be formed in the stack ST2 including the first insulation layer 20, the gate electrode 24, and the second insulation layer 26 by an etching process. After the etching, the mask M2 is removed.

Figure 8:
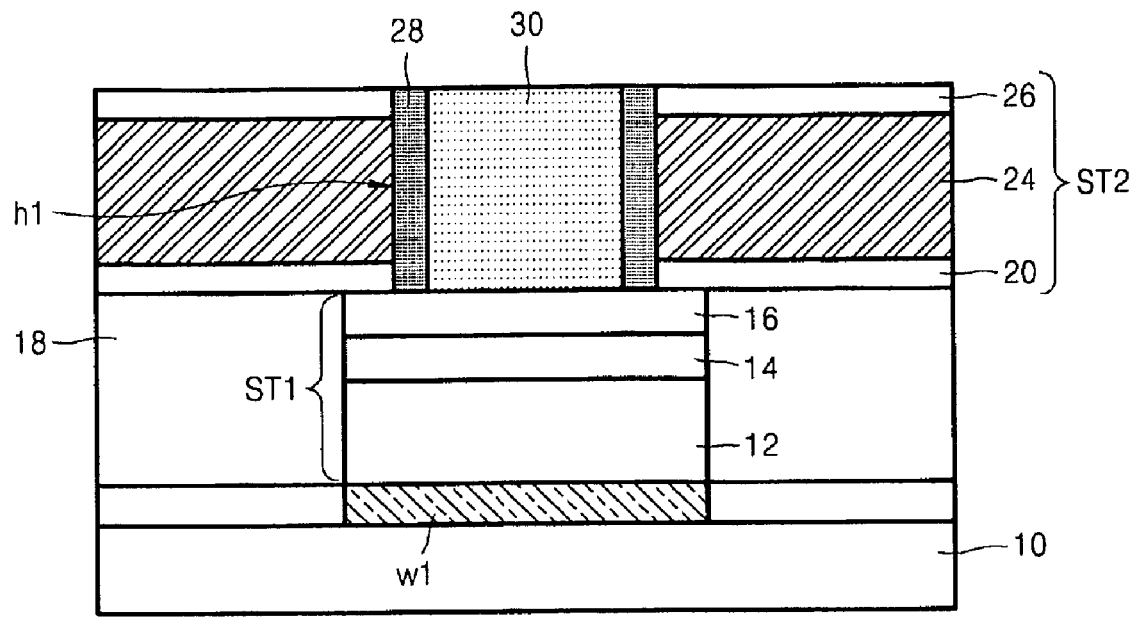

Next, referring to FIG. 8, the space insulation layer 28 is formed on sidewalls of the via hole h1 of the stack ST2. The thickness of the space insulation layer 28 can be between about 1 nm and about 100 nm. The space insulation layer 28 may be formed by forming a thin insulation layer (not shown) covering a resultant structure in which the stack ST2 is formed and performing anisotropic etching for the thin insulation layer. Due to the characteristics of anisotropic etching, portions of the thin insulation layer other than a portion formed on inner sidewalls of the via hole h1 are removed. Next, the via hole h1 in which the space insulation layer 28 is formed may be filled with the phase change material layer 30. The phase change material layer 30 can be formed, for example, of the material layers stated above in connection with the description of FIG. 2, and is spaced apart from the gate electrode 24 by at least the space insulation layer 28. The gate electrode 24 can be positioned to surround the sidewalls of the phase change material layer 30.

Figure 9:
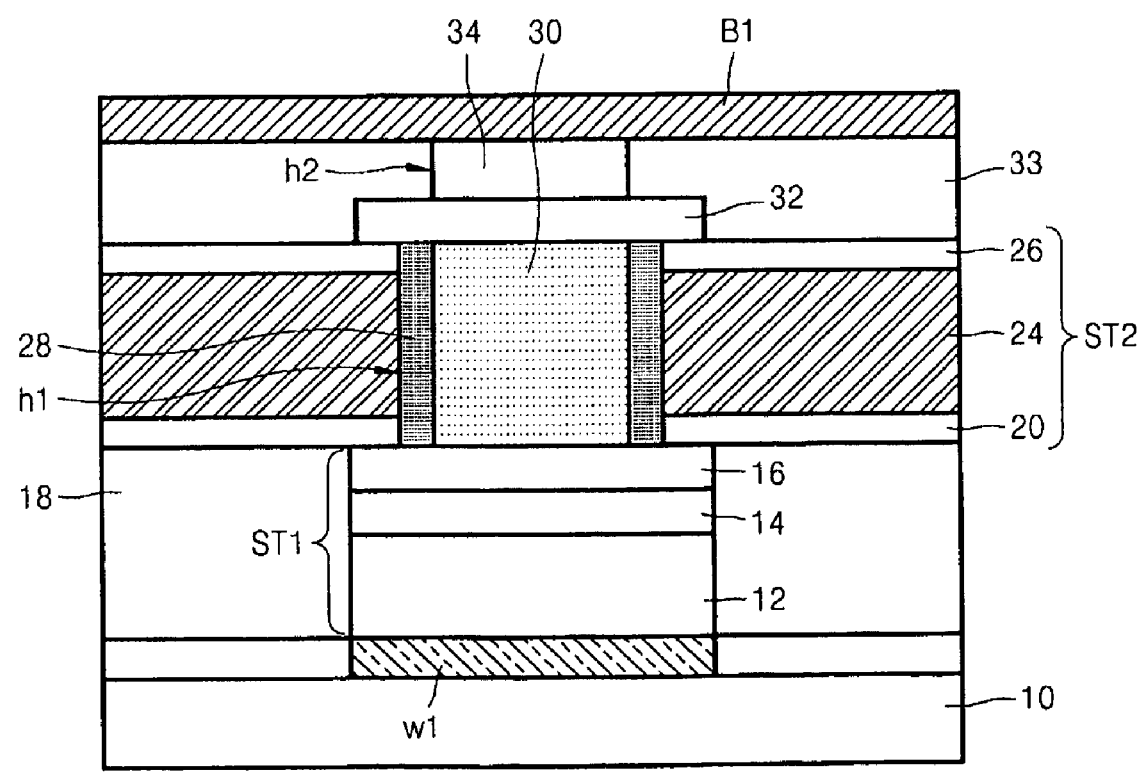

Referring to FIG. 9, the top electrode 32 covering the top surface of the phase change material layer 30 may be formed on the second insulation layer 26. The top electrode 32 may be formed by using general stacking, photolithography, and etching methods. Next, an interlayer insulation layer 33 covering the top electrode 32 may be formed on the second insulation layer 26. A via hole h2 by which the top surface of the top electrode 32 is partially exposed is then formed in the interlayer insulation layer 33. The via hole h2 may be filled with the top electrode contact layer 34. The bitline B1 covering an exposed upper surface of the top electrode contact layer 34 may be formed on the interlayer insulation layer 33.

Thus, a memory device can be fabricated.

Meanwhile, a field-effect transistor, which is a type of a switching device that is different from a diode, may be formed instead of the stack ST1 on the substrate 10. A gate of the field-effect transistor may be connected to a wordline by general methods. Furthermore, in this case, the phase change material layer 30 may be formed to be connected to a source of the field-effect transistor either directly or via a conductive plug.

Furthermore, when the stack ST1 is formed on the substrate 10, the interlayer insulation layer 18 may first be formed, and then a hole may be formed therein, and then the hole may be filled with the stack ST1. Furthermore, various methods of forming the stack ST1 and the interlayer insulation layer 18 to have same height by forming and planarizing the stack ST1 and the interlayer insulation layer 18 may be used. The methods described above are merely examples of various methods that can be used to form the stack ST1. Any method for forming the stack ST1 under the first insulation layer 20 is applicable to the embodiments of the inventive concept.

Figure 10:
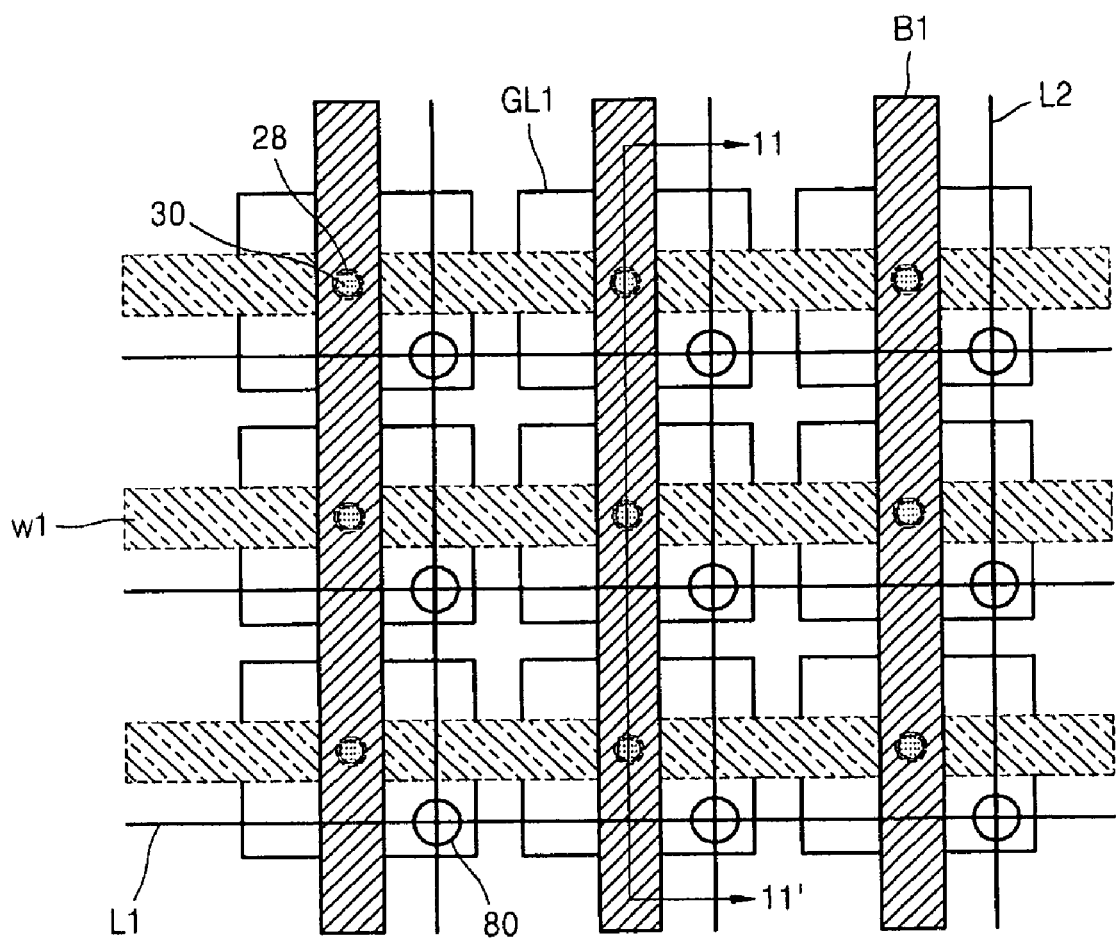
FIG. 10 is a plan view of a phase change memory device according to an exemplary embodiment of the inventive concept, in which an individual gate electrode is disposed in each of memory cells.

Furthermore, as shown in FIG. 10, in other embodiments, each of memory cells may include an independent gate electrode. For convenience of explanation, FIG. 10 only illustrates the bitlines B1, the wordlines W1, and independent gate electrodes GL1 each of which respectively corresponds to each of the memory cells.

In the case of FIG. 10, each of gate electrodes GL1 independently included in each of the memory cells may include its own, independent contact plug 80. In this case, the number of the first gate selecting lines GS1 of FIG. 1 may be the same as the number of wordlines W1, whereas the number of the second gate selecting lines GS2 of FIG. 1 may be the same as the number of the bitlines B1. In the embodiment of FIG. 10, first lines L1 disposed in parallel to the wordlines W1 may correspond to the first gate selecting lines GS1, whereas second lines L2 disposed in parallel with the bitlines B1 may correspond to the second gate selecting lines GS2. Furthermore, the independent gate electrodes GL1 may be selected by selecting the corresponding wordline W1 and bitline B1 and by applying a voltage to at least one of the first line L1, which corresponds to the selected wordline W1, and the second line L2, which corresponds to the selected bitline B1.

Figure 11:
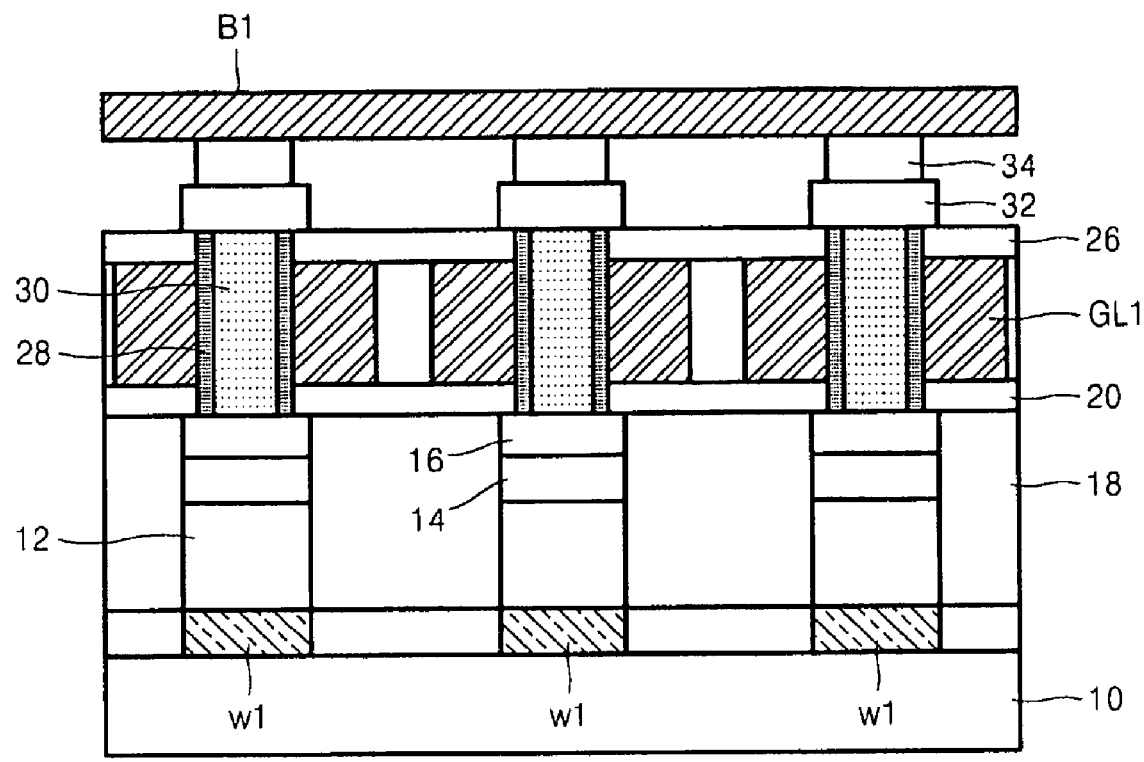
FIG. 11 is a sectional view of the phase change memory device of FIG. 10, obtained along section line 11-11'.

FIG. 11 is a sectional view obtained along section line 11-11' of FIG. 10. FIG. 11 illustrates the independent gate electrodes GL1 each of which respectively corresponds to each of the memory cells.

In another embodiment, instead of disposing one independent gate electrode GL1 for each of the memory cells, a plurality of memory cells may be grouped into a unit block and one independent gate electrode may be disposed in each of the unit blocks. The number of memory cells in each of the unit blocks may be 2~$10^6$, for example. At this point, each of the unit blocks may include at least one gate electrode selecting line.

Next, a method of operating a memory device according to the current exemplary embodiment described above will be described. Here, FIGS. 1 and 3 will be referred to for the purposes of illustrating the method.

<Writing Operation>

The bitline B1 and the wordline W1 corresponding with a memory cell to be written may be selected by the bitline selecting circuit 50 and the wordline selecting circuit 60. For the purpose of illustration, it is assumed that the selected wordline W1 is the wordline in the second row in FIG. 1, and it is assumed that the selected bitline B1 is the bitline in the second column in FIG. 1. In this case, selected memory cell can be the memory cell C1 shown in FIG. 3. After a memory cell is selected, data is written to the selected memory cell C1. The writing operation may be an operation of changing state of the phase change material layer 30 of the selected memory cell C1 from a crystalline state to an amorphous state.

The operation of changing state of the phase change material layer 30 may be performed as described below.

More particularly, a voltage can be applied to either the first gate selecting line GS1 or the second gate selecting line G2 shown in FIG. 1. The first gate selecting line GS1 or the second gate selecting line GS2 may be connected to the gate electrode 24, which is disposed around the phase change material layer 30, via the gate contact plug 70. Therefore, the voltage applied to the first gate selecting line GS1 or the second gate selecting line G2 may be applied to the gate electrode 24. The voltage applied to the gate electrode 24 can be about 0.1V to about 100V. An electric field is generated by the gate electrode 24 due to the voltage applied to the gate electrode 24. Thus, the phase change material layer 30 surrounded by the gate electrode 24 may be affected by the electric field. Accordingly, a writing voltage is applied to the selected memory cell C1, under the effect of the electric field via the bitline B1 and the wordline W1. The application of the writing voltage and the application of the voltage to the gate electrode 24 may be performed simultaneously. A reset current flows in the phase change material layer 30 due to the writing voltage, and the state of the phase change material layer 30 is changed to an amorphous state (a reset programming operation). Due to the electric field, the electrical resistance of the phase change material layer 30 increases. Thus, the reset current required to change the state of the phase change material layer 30 to an amorphous state decreases. As writing data to the phase change material layer 30 is completed, voltage application to the gate electrode 24 is ceased. Accordingly, writing data to the selected memory cell C1 may be completed. When the state of the phase change material layer 30 is changed to an amorphous state, in one embodiment, a data value of '1' is written to the phase change material layer 30.

After writing the data 1, a voltage (a second voltage hereinafter) different from the writing voltage may be applied to the phase change material layer 30. At this point, the second voltage may be a reading voltage for reading the data 1 or a voltage for changing the data 1 to data 0.

Meanwhile, if application of the writing voltage is to change state of the phase change material layer 30 from an amorphous state to a crystalline state, voltage is not applied to the first and second gate selecting line GS1 and GS2 when the writing voltage is applied. Thus, the electric field is not generated. When the state of the phase change material layer 30 is changed from an amorphous state to a crystalline state due to application of the writing voltage, data 0 is written to the phase change material layer 30. If an initial state of the phase change material layer 30 is a crystalline state, it may not be necessary to apply the writing voltage for writing data 0. In the descriptions above, the data values '0' and '1' corresponding to states of the phase change material layer can be reversed.

As described above, in a memory device according to an exemplary embodiment of the inventive concept, a reset current is not lowered by changing the dimension of the phase change material layer 30 such as the length and/or the width of the same. Instead, the memory device increases the electrical resistance of the phase change material layer 30 by externally applying an electric field to the phase change material layer 30 only when the reset current is applied. Thus, the reset current is decreased, but set resistance is not increased. Therefore, the electrical resistance when data 1 is written and the electrical resistance when data 0 is written may be clearly distinguished from each other. Thus, a sufficient reading margin may be secured for clearly distinguishing data during data reading operations.

On the other hand, if a switching device connected to the phase change material layer 30 is a transistor, a gate electrode of the transistor may function as a wordline. Therefore, if the switching device is the transistor and the phase change material layer 30 is connected to either of first or second impurity regions, which may be used as sources or drains, a writing voltage may be applied to the phase change material layer 30 by applying a voltage between the bitline B1 and the second impurity region of the transistor during the writing operations. For convenience of explanation, it is assumed that the phase change material layer 30 is connected to the first impurity region. Application of an electric field to the phase change material layer 30 may be as described above.

<Reading Operation>

A reading voltage may be applied to the selected memory cell C1 via the bitline B1 and the wordline W1. At this point, the reading voltage may be lower than threshold voltage which can affect the state of the phase change material layer 30. Therefore, application of the reading voltage does not affect data written in the phase change material layer 30. After applying the reading voltage to the phase change material layer 30 and measuring the current in the phase change material layer 30, the measured current may be compared to a reference current. If the measured current is greater than the reference current, this may mean that the phase change material layer 30 is in a crystalline state. Thus, measuring the current may mean reading data 0. In contrast, if the measured current is smaller than the reference current, it may mean that the phase change material layer 30 is in an amorphous state. Thus, in this case, measuring the current may mean reading data 1.

Following the reading operations stated above, the writing operations may be performed to a memory cell from which data has been read.

Although descriptions of the reading and writing operations above refer to a case in which two gate selecting lines crossing each other are disposed in a memory array including unit memory cell blocks, these descriptions may also be applied to a case in which the memory array includes only one gate selecting line.

While aspects of the inventive concept has been particularly shown and described with reference to different embodiments thereof, it should be understood that these exemplary embodiments should be considered in a descriptive sense only and not for purposes of limitation. For example, those ordinarily skilled in the art to which the inventive concept belongs may apply the method of applying electric field during the reset programming to structures of other widely-known phase change memory devices other than the structure of the memory device described above. Therefore, the scope of the inventive concept is defined not by the detailed description of the inventive concept but by the appended claims, and all differences within the scope will be construed as being included in the inventive concept.

What is claimed is:

1. A phase change memory device comprising:
   a switching device;
   a phase change storage node connected to the switching device; and
   a gate electrode which is spaced apart from the phase change storage node and increases an electrical resistance of the storage node during a reset programming operation, wherein the gate electrode is disposed around the phase change storage node such that the gate electrode surrounds sidewalls of the phase change storage node.

2. The phase change memory device of claim 1, wherein the switching device comprises at least one of a diode and a transistor.

3. The phase change memory device of claim 1, further comprising an ohmic contact conductive layer in series between the switching device and the phase change storage node.

4. The phase change memory device of claim 1, further comprising a space insulation layer between the storage node and the gate electrode.

5. The phase change memory device of claim 1, further comprising a plurality of the switching devices and a plurality of the phase change storage nodes,
wherein the gate electrode corresponds with at least one of the storage nodes.

6. The phase change memory device of claim 1, wherein the gate electrode is an element from which an electric field is applied to the phase change storage node.

* * * * *